(12) United States Patent
Tao et al.

(10) Patent No.: US 6,415,853 B1
(45) Date of Patent: Jul. 9, 2002

(54) WIND COVER LOCKING ELEMENT STRUCTURE OF HEAT RADIATOR

(75) Inventors: Chian Tao; Chen-Hsing Lee; Kuet Yin Kuo; Chia Min Chou; Po-Chou Shih, all of Sanchung (TW)

(73) Assignee: Chaun-Choung Technology Corp., Taipei Hsien (TW)

( * ) Notice: Subject to any disclaimer, the term of this patent is extended or adjusted under 35 U.S.C. 154(b) by 0 days.

(21) Appl. No.: 10/051,128

(22) Filed: Jan. 22, 2002

(51) Int. Cl.⁷ ................................................ H05K 7/20
(52) U.S. Cl. ...................... 165/80.3; 165/121; 165/185; 174/16.3; 257/719; 361/697
(58) Field of Search ................................ 165/80.3, 121, 165/185; 174/16.3; 257/718, 719, 722; 361/697, 704

(56) References Cited

U.S. PATENT DOCUMENTS

| | | | | |
|---|---|---|---|---|
| 5,602,719 A | * | 2/1997 | Kinion | 165/185 |
| 5,864,464 A | * | 1/1999 | Lin | 165/80.3 |
| 6,017,185 A | * | 1/2000 | Kuo | 165/121 |
| 6,266,245 B1 | * | 7/2001 | Wei | 165/185 |

* cited by examiner

Primary Examiner—Leonard Leo
(74) Attorney, Agent, or Firm—Rosenberg, Klein & Lee

(57) ABSTRACT

The present invention provides a wind cover locking element structure of heat radiator comprising a locking element, a heat radiator, a wind cover, and a socket. Projective sheet bodies are disposed at both sides of openings on two sideboards of the wind cover. The sheet bodies have abutting and positioning functions. When the locking element and the socket are locked together, the sheet bodies can abut against the locking portions of the locking element so as to be positioned, thereby reducing the shift between the locking element and the heat radiator. The heat radiator can thus be accurately stuck on a CPU.

5 Claims, 5 Drawing Sheets

WIND COVER LOCKING ELEMENT STRUCTURE OF HEAT RADIATOR

FIELD OF THE INVENTION

The present invention relates to a wind cover locking element structure of heat radiator and, more particularly, to a wind cover locking element structure of heat radiator capable of reducing the shift between a locking element and a heat radiator so that the heat radiator can be accurately stuck on a central processing unit.

BACKGROUND OF THE INVENTION

Because of fast upgrade of the computer industry, computers have more and more powerful operational capacity. The operational speed of a central processing unit (CPU) continually increases, and the generated heat increases accordingly. In order to let the CPU operate at permissible temperatures, many kinds of heat radiators for increasing the heat-radiating area have been designed to meet the requirement of CPUs radiating more heat. Moreover, in order to dispose the heat radiators on the CPUs, locking elements of heat radiator have been proposed.

As shown in FIG. 1, a prior art locking element 10a of a heat radiator 20a is a bar-shaped sheet body. Two ends of the locking element 10a are bent to form resilient locking portions 11a. A locking hole 12a is disposed on each of the two locking portions 11a. Locking bodies 31a corresponding to the locking holes 12a are disposed at sides of the socket 30a of a CPU 40a corresponding to the two locking portions 11a. A groove 21a for receiving the locking element 10a is also disposed at the center of the heat radiator 20a to let the locking element 10a abut against the bottom of the groove 21a and the locking holes 12a be locked with the locking bodies 31a, thereby letting the heat radiator 20a be firmly stuck on the CPU 40a. The heat radiator 20a can thus be used to increase the heat-radiating area to help the CPU 40a radiate out heat. Additionally, a wind cover (not shown) can be further disposed on the heat radiator. The wind cover is screwed on the heat radiator with a plurality of screws. A fan is disposed on the wind cover so that the wind cover can properly collect heat of the CPU and the heat radiator and the fan can be used to discharge the heat out, thereby achieving better heat-radiating effect.

However, when the above locking element 10a of heat radiator and the socket 30a are to be locked together, it is necessary to first lock the locking hole 12a at one end of the locking element 10a and the locking body 31a at one side of the socket 30a together. The locking hole 12a at the other end of the locking element 10a and the locking body 31a at the other side of the socket 30a can then be locked together. Because the locking holes 12a at the two ends of the locking element 10a and the locking bodies 31a at the two sides of the socket 30a are not locked together simultaneously, there will be shift between the locking element 10a and the heat radiator 20a during the process of locking the two locking holes 12a of the locking element 10a and the two locking bodies 31a of the socket 30a together. Therefore, the heat radiator 20a cannot be accurately stuck on the CPU 40a, hence greatly deteriorating the heat-radiating efficiency of the heat radiator 40a.

Accordingly, the above locking element of heat radiator has inconvenience and drawbacks in practical use. The present invention aims to resolve the problems in the prior art.

SUMMARY OF THE INVENTION

The primary object of the present invention is to provide a wind cover locking element structure of heat radiator for reducing the shift between a locking element and a heat radiator so that the heat radiator can be accurately stuck on a CPU. Therefore, the heat-radiating effect of the heat radiator can be exactly exploited to achieve better heat-radiating effect.

To achieve the above object, the present invention provides a wind cover locking element structure of heat radiator comprising a locking element, a heat radiator, a wind cover, and a socket. The locking element has a main body and two locking portions. A locking hole is disposed on each of the two locking portions. The heat radiator has a plurality of heat-radiating fins. A groove is formed on the heat radiator. The main body of the locking element is received in the groove. The wind cover has two sideboards. The wind cover is fixed on the heat radiator. An opening is disposed on each of the sideboards. Projective sheet bodies are disposed at both sides of the opening. Locking bodies are disposed on both sides of the socket. The heat radiator is placed on the socket. The two locking bodies of the socket match the two locking holes of the locking element. When the locking element and the socket are locked together, the sheet bodies can abut against the locking portions of the locking element so as to be positioned, thereby reducing the shift between the locking element and the heat radiator.

The various objects and advantages of the present invention will be more readily understood from the following detailed description when read in conjunction with the appended drawing, in which:

DETAILED DESCRIPTION OF THE PREFERRED EMBODIMENTS

Figure 1:
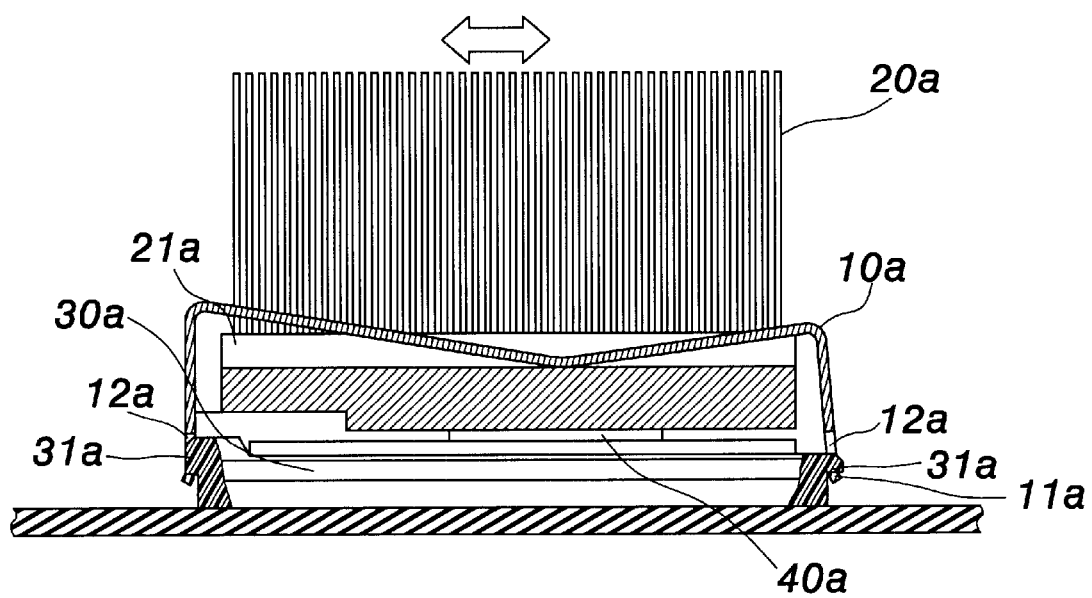
FIG. 1 is plan view of a locking element of heat radiator in the prior art.
Figure 2:
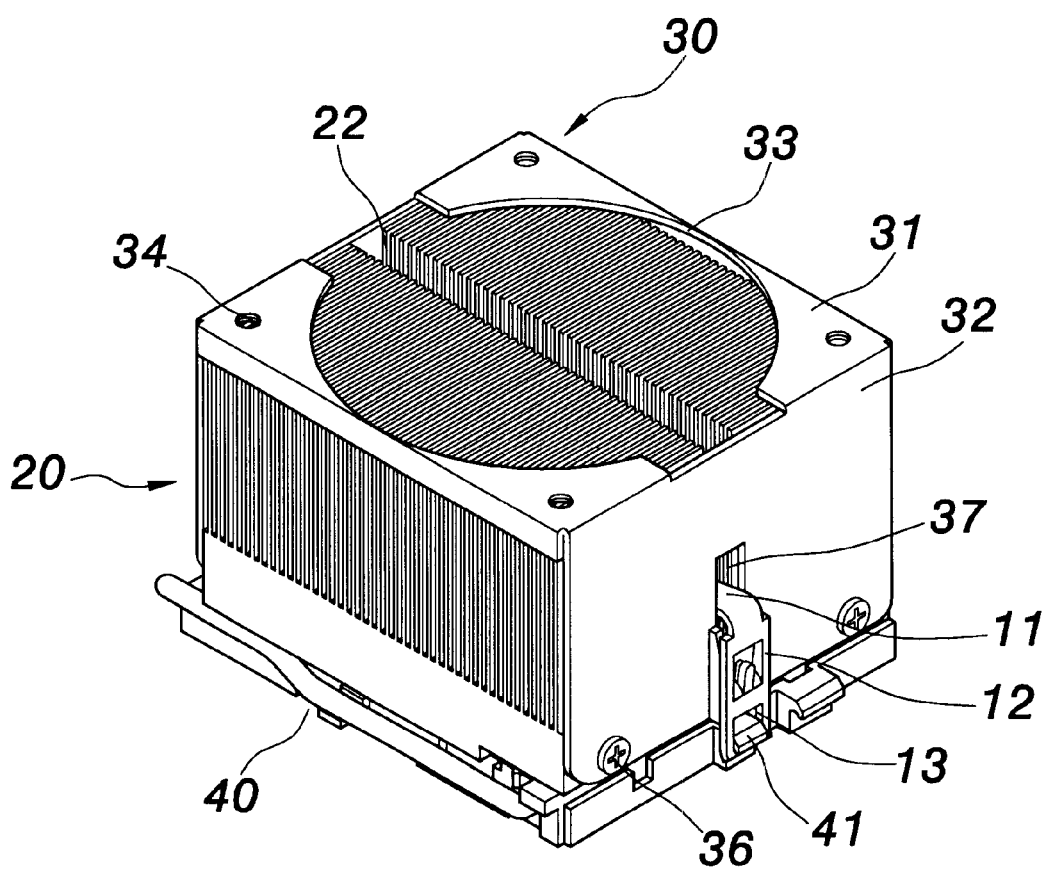
FIG. 2 is a perspective assembly view of the present invention.
Figure 3:
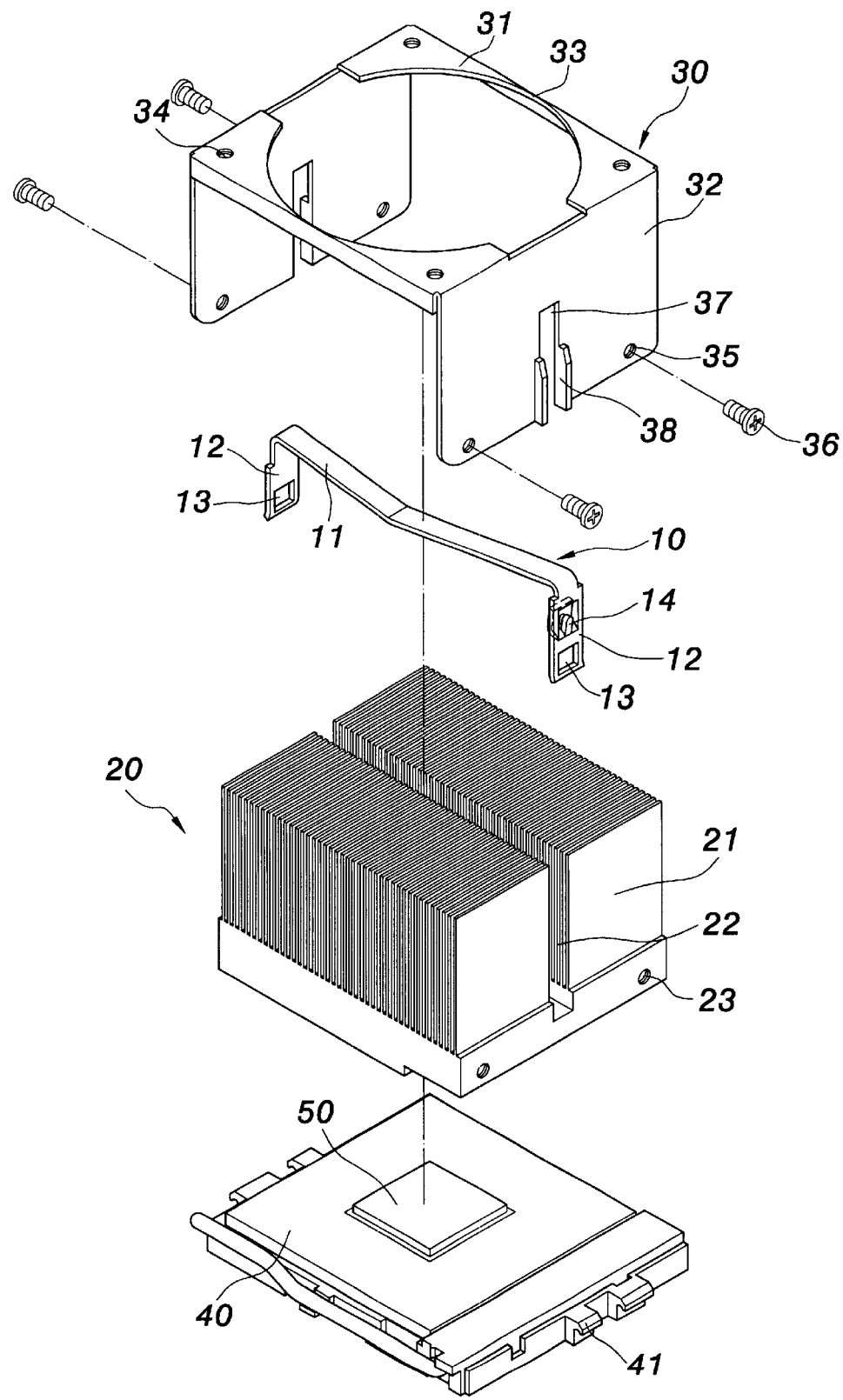
FIG. 3 is an exploded perspective view of the present invention.
Figure 4:
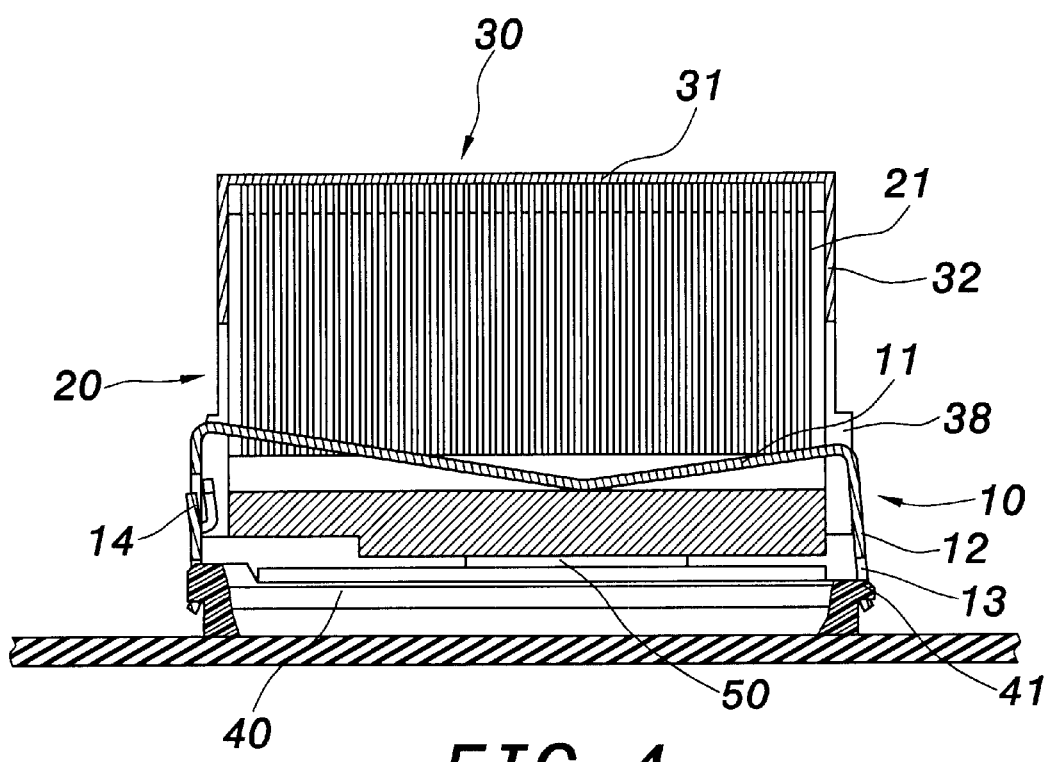
FIG. 4 is a plan view of the present invention.

As shown in FIGS. 2, 3, and 4, the present invention provides a wind cover locking element structure of heat radiator comprising a locking element 10, a heat radiator 20, a wind cover 30, and a socket 40. The locking element 10 is integrally formed by bending a metallic sheet body. The locking element 10 has a main body 11 and two locking portions 12. The main body 11 is a roughly V-shaped sheet body with two ends thereof respectively connected at the resilient locking portions 12. A locking hole 13 is disposed on each of the two locking portions 12. A turn portion 14 is also disposed on one of the two locking portions 12 so that the locking portion 12 can be turned by inserting a tool like a screwdriver into the turn portion 14.

The heat radiator 20 is made of material having good heat conductivity (e.g., aluminum or copper). The heat radiator 20 has a plurality of heat-radiating fins 21 to increase the heat-radiating area. A groove 22 for receiving the locking element 10 is formed at the center of the heat radiator 20. The groove 22 can also be used as a wind passageway to facilitate wind flow. When the main body 11 is received in the groove 22, the main body 11 can abut against the bottom of the groove 22. The two locking portions of the locking element 10 stick out the front and rear sides of the heat radiator 20. Two wind cover locking holes 23 are disposed at the front and rear sides of the heat radiator 20.

The wind cover 30 is made of material having good heat conductivity (e.g., aluminum or copper). The wind cover 30 has a top board 31 and a front and a rear sideboards 32. The two sideboards 32 are formed by extending downwards the front and rear sides of the top board 31. A circular through hole 33 is formed on the top board 31. A fan fixing hole 34 is disposed near each of four corners of the top board 31. A fan (not shown) can be screwed on the top board 31 with screws. Two holes 35 corresponding to the wind cover fixing holes 23 are disposed on each of the two sideboards 32. Screws 36 can be used to pass through the holes 35 and then be screwed to the wind cover fixing holes 23. The wind cover 30 can thus be fixed on the heat radiator 20. An opening 37 corresponding to the front or rear side of the groove 22 of the heat radiator 20 can be disposed at the center of each of the two sideboards 32. Projective sheet bodies 38 are disposed at the left and right sides of the opening 37.

The socket 40 is approximately as a common socket structure. A CPU 50 can be inserted on the socket 40. Locking bodies 41 corresponding to the locking holes 13 are disposed on two sides of the socket 40 corresponding to the two locking portions 12. The two locking bodies 41 of the socket 40 can match the two locking holes 13 of the locking element 10. The heat radiator 20 is placed on the socket 40, and the bottom of the heat radiator 20 is stuck on the CPU 50 so that the heat radiator 20 can help the CPU radiate out heat.

Figure 5:
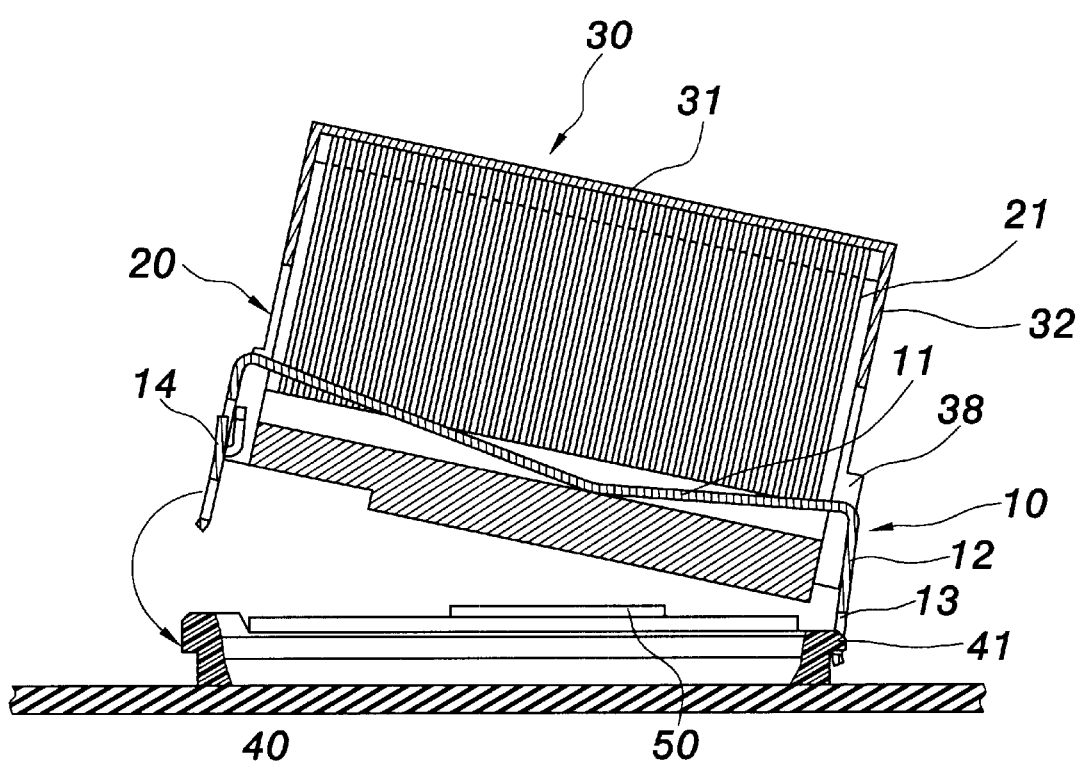
FIG. 5 is a diagram showing the locking actions of the locking element and the socket of the present invention.

The present invention is characterized mainly in that the projective sheet bodies 38 are disposed at the two sides of the openings 37 on the two sideboards 32 of the wind cover 30. The projective sheet bodies 38 have abutting and positioning functions. In the present invention, when the locking element 10 and the socket 40 are to be locked together, it is necessary to first lock the locking hole 13 at one end of the locking element 10 and the locking body 41 at one side of the socket 40 together, as shown in FIG. 5. The locking hole 13 at the other end of the locking element 10 and the locking body 41 at the other side of the socket 40 can then be locked together. Although the locking holes 13 at the two ends of the locking element 10 and the locking bodies 41 at the two sides of the socket 40 are not locked together simultaneously, because the sheet bodies 38 can abut against the locking portions 12 of the locking element 10 during the process of locking the two locking holes 13 of the locking element 10 and the two locking bodies 41 of the socket 40 together, the locking portions 12 of the locking element 10 can stride on the sheet bodies 38 so as to be positioned. The shift between the locking element 10 and the heat radiator 20 can thus be reduced. Therefore, the heat radiator 20 can be accurately stuck on the CPU 50, letting the heat-radiating efficiency of the heat radiator 20 be exactly exploited for achieving better heat-radiating effect.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A wind cover locking element structure of heat radiator, comprising:

a locking element having a main body and two locking portions, a locking hole being disposed on each of said two locking portions;

a heat radiator having a plurality of heat-radiating fins, a groove being formed on said heat radiator, said main body of said locking element being received in said groove;

a wind cover having two sideboards, said wind cover being fixed on said heat radiator, an opening being disposed on each of said two sideboards, projective sheet bodies being disposed at two sides of said opening; and a socket having locking bodies at two sides thereof, said heat radiator being placed on said socket, said two locking bodies of said socket matching said two locking holes of said locking element;

whereby when said locking element and said socket are locked together, said sheet bodies can abut against said locking portions of said locking element so as to be positioned, hence reducing the shift between said locking element and said heat radiator.

2. The wind cover locking element structure of heat radiator as claimed in claim 1, wherein a turn portion is disposed on one of said locking portions of said locking element.

3. The wind cover locking element structure of heat radiator as claimed in claim 1, wherein a plurality of wind cover fixing holes are disposed on said heat radiator, holes corresponding to said wind cover fixing holes being disposed on said two sideboards of said wind cover, screws being used to pass through said holes and be screwed to said wind cover fixing holes for fixing said wind cover on said heat radiator.

4. The wind cover locking element structure of heat radiator as claimed in claim 1, wherein a plurality of fan fixing holes are disposed on a top board of said wind cover so that a fan can be fixed thereon with screws.

5. The wind cover locking element structure of heat radiator as claimed in claim 1, wherein said wind cover further has a top board having a through hole.

* * * * *